US012771350B2

(12) United States Patent
Hara

(10) Patent No.: US 12,771,350 B2
(45) Date of Patent: Oct. 20, 2026

(54) DRIVE CIRCUIT

(71) Applicant: ROHM CO., LTD., Kyoto (JP)

(72) Inventor: Hideo Hara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 10 days.

(21) Appl. No.: 19/088,127

(22) Filed: Mar. 24, 2025

(65) Prior Publication Data

US 2025/0309888 A1 Oct. 2, 2025

(30) Foreign Application Priority Data

Mar. 26, 2024 (JP) ................................ 2024-050192

(51) Int. Cl.
*H03K 19/0185* (2006.01)

(52) U.S. Cl.
CPC ................ *H03K 19/018521* (2013.01); *H03K 2217/0063* (2013.01)

(58) Field of Classification Search
None
See application file for complete search history.

(56) References Cited

U.S. PATENT DOCUMENTS 6,037,720 A * 3/2000 Wong ................ H03K 17/6871 327/236
8,723,552 B2 * 5/2014 Tseng .............. H03K 19/00361 326/82
8,975,944 B2 * 3/2015 Akahane .......... H03K 3/356182 326/62
9,685,859 B2 * 6/2017 Akahane ................ H03K 17/18
10,218,345 B2 * 2/2019 Sakai .................. H03K 17/107
10,680,614 B1 * 6/2020 Knoedgen ........ H03K 3/356034
10,897,255 B2 * 1/2021 Akahane .............. H03K 17/161
11,309,893 B2 * 4/2022 Akahane ........ H03K 19/018521
11,476,847 B2 * 10/2022 Fukudome ........... H03K 17/687
11,626,877 B2 * 4/2023 Niikura ................. H02M 3/155 323/282

FOREIGN PATENT DOCUMENTS

WO 2021131157 A1 7/2021

* cited by examiner

*Primary Examiner* — Thomas J. Hiltunen
(74) *Attorney, Agent, or Firm* — CANTOR COLBURN LLP

(57) ABSTRACT

A drive circuit includes: a level shift circuit configured to convert a plurality of first pulse signals to a plurality of low-level set pulse signals, respectively, and output the set pulse signals sequentially to a first transmission line, and configured to convert a second pulse signal to a low-level reset pulse signal and output the reset pulse signal to a second transmission line; a detection circuit configured to output a first detection signal in response to detecting that a first voltage is at a low level, and output a second detection signal in response to detecting that a second voltage is at a low level; and a restoration circuit configured to set a switching element, which is provided between a power supply line of a high-side power supply potential and the first transmission line, to the on state in response to a first-first detection signal output from the detection circuit.

4 Claims, 8 Drawing Sheets

DRIVE CIRCUIT

CROSS-REFERENCE TO RELATED APPLICATION

The present invention claims priority under 35 U.S.C. § 119 to Japanese Patent Application No. 2024-050192, filed on Mar. 26, 2024, the entire contents of which are incorporated herein by reference.

TECHNICAL FIELD

The present disclosure relates to a drive circuit.

BACKGROUND

There is known an upper driver that controls on/off of an upper switching element among upper and lower switching elements connected in series. For example, in the upper driver, the upper switching element and the lower switching element are connected in series between a P terminal and an N terminal, and a node to which the upper switching element and the lower switching element are connected is connected to an output terminal.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
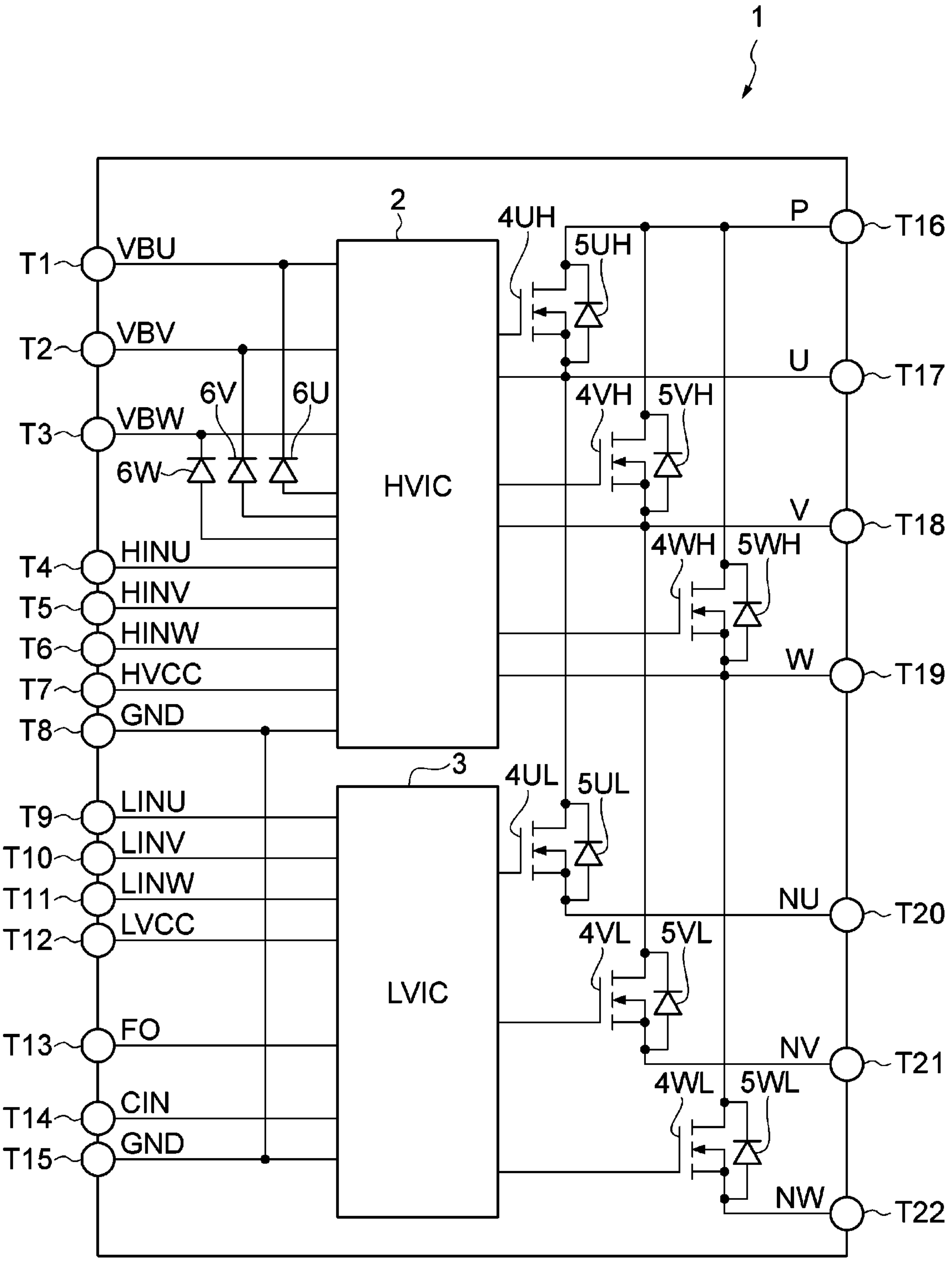
FIG. 1 is a diagram showing an exemplary internal configuration of an intelligent power module (IPM) including a drive circuit for a high-side transistor according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment of the present disclosure will be described in detail below with reference to the drawings. In the description of the drawings, the same elements are denoted by the same reference numerals, and duplicate explanation thereof will be omitted.

Figure 2:
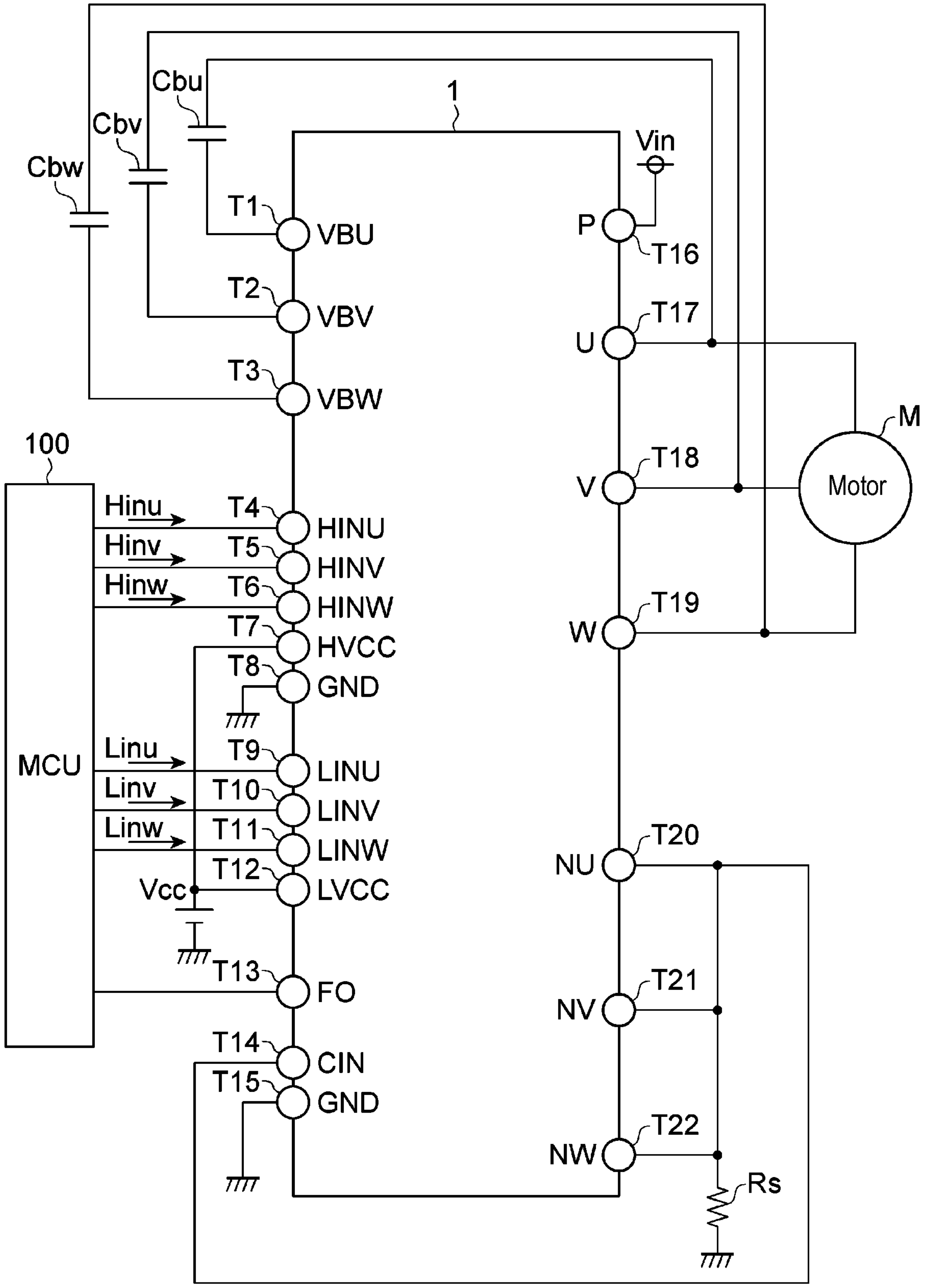
FIG. 2 is a diagram showing an application example of the IPM shown in FIG. 1.

An IPM including a drive circuit for a high-side transistor according to one embodiment will be described with reference to FIG. 1 and FIG. 2. FIG. 1 is a diagram showing an exemplary internal configuration of the IPM including a drive circuit for a high-side transistor according to one embodiment. FIG. 2 is a diagram showing an application example of the IPM shown in FIG. 1.

The IPM 1 shown in FIG. 1 and FIG. 2 is a device in which a power element and a gate driver are enclosed in one package. For example, a dual in-line package (DIP) is used as the package of the IPM 1. Any package such as a shrink dual in-line package with heat sink (HSDIP) and a surface mount device (SMD) can be used as the package of the IPM 1. The IPM 1 is controlled by, for example, a micro control unit (MCU) 100, and drives a motor M. An example of the motor M is a three-phase direct current (DC) brushless motor.

In order to establish an electrical connection with the outside, the IPM 1 has a VBU terminal T1, a VBV terminal T2, a VBW terminal T3, an HINU terminal T4, an HINV terminal T5, an HINW terminal T6, an HVCC terminal T7, a GND terminal T8, an LINU terminal T9, an LINV terminal T10, an LINW terminal T11, an LVCC terminal T12, an FO terminal T13, a CIN terminal T14, a GND terminal T15, a P terminal T16, a U terminal T17, a V terminal T18, a W terminal T19, an NU terminal T20, an NV terminal T21, and an NW terminal T22.

The VBU terminal T1 is a terminal supplied with a power supply voltage for floating control of a U phase. The VBU terminal T1 is connected to the U terminal T17 via a capacitor Cbu. The VBV terminal T2 is a terminal supplied with a power supply voltage for floating control of a V phase. The VBV terminal T2 is connected to the V terminal T18 via a capacitor Cbv. The VBW terminal T3 is a terminal supplied with a power supply voltage for floating control of a W phase. The VBW terminal T3 is connected to the W terminal T19 via a capacitor Cbw.

The HINU terminal T4 is connected to the MCU 100, and is a terminal to which an input signal Hinu for controlling a U-phase high-side transistor (transistor 4UH) is input from the MCU 100. The HINV terminal T5 is connected to the MCU 100, and is a terminal to which an input signal Hinv for driving a V-phase high-side transistor (transistor 4VH) is input from the MCU 100. The HINW terminal T6 is connected to the MCU 100, and is a terminal to which an input signal Hinw for controlling the W-phase high-side transistor (transistor 4WH) is input from the MCU 100. The HVCC terminal T7 is a terminal that supplies a power supply voltage to a high-side gate driver (drive circuit 2). The HVCC terminal T7 is supplied with a power supply voltage Vcc. The GND terminal T8 is a terminal connected to a ground line GLL that supplies a low-side ground potential.

The LINU terminal T9 is connected to the MCU 100, and is a terminal to which an input signal Linu for controlling a U-phase low-side transistor (transistor 4UL) is input from the MCU 100. The LINV terminal T10 is connected to the MCU 100, and is a terminal to which an input signal Linv for driving a V-phase low-side transistor (transistor 4VL) is input from the MCU 100. The LINW terminal T11 is connected to the MCU 100, and is a terminal to which an input signal Linw for controlling a W-phase low-side transistor (transistor 4WL) is input from the MCU 100.

The LVCC terminal T12 is a terminal that supplies a power supply voltage to a low-side gate driver (drive circuit 3). The LVCC terminal T12 is supplied with the power supply voltage Vcc. The FO terminal T13 is connected to the MCU 100, and is a terminal that outputs a fault signal indicating the presence or absence of abnormality to the MCU 100. The CIN terminal T14 is a terminal to which a current detection signal indicating that a current flowing through the low-side transistors (the transistor 4UL, the transistor 4VL, and the transistor 4WL) has been detected is input. The GND terminal T15 is a terminal connected to the ground line GLL, and is connected to the GND terminal T8 inside the IPM 1.

The P terminal T16 is a positive terminal to which an input voltage Vin is supplied. The input voltage Vin is, for example, 100 V to 1,700 V. The U terminal T17 is a U-phase output terminal. The U terminal T17 is connected to a U-phase terminal of the motor M. The V terminal T18 is a V-phase output terminal. The V terminal T18 is connected to a V-phase terminal of the motor M. The W terminal T19 is a W-phase output terminal. The W terminal T19 is connected to a W-phase terminal of the motor M.

The NU terminal T20 is a U-phase negative terminal. The NV terminal T21 is a V-phase negative terminal. The NW terminal T22 is a W-phase negative terminal. The NU terminal T20, the NV terminal T21, and the NW terminal T22 are connected to the ground line GLL via a common resistor element Rs.

The IPM 1 includes, as built-in components, the drive circuit 2, the drive circuit 3, the transistors 4UH, 4UL, 4VH, 4VL, 4WH, and 4WL (hereinafter referred to as "transistors 4UH to 4WL"), freewheeling diodes 5UH, 5UL, 5VH, 5VL, 5WH, and 5WL (hereinafter referred to as "freewheeling diodes 5UH to 5WL"), and diodes 6U, 6V, and 6W.

The drive circuit 2 is a drive circuit for high-side transistors (the transistor 4UH, the transistor 4VH, and the transistor 4WH), and is also referred to as a high-side gate driver. Details of the drive circuit 2 will be described later. The drive circuit 3 is a drive circuit for low-side transistors (the transistor 4UL, the transistor 4VL, and the transistor 4WL), and is also referred to as a low-side gate driver.

Each of the transistors 4UH to 4WL is a power element. Each of the transistors 4UH to 4WL may be a metal oxide semiconductor field effect transistor (MOSFET) or an insulated gate bipolar transistor (IGBT). The MOSFET and the IGBT may be formed on a silicon (Si) substrate or a silicon carbide (SiC) substrate. In the present embodiment, an N-channel MOSFET formed on a SiC substrate is exemplified as each of the transistors 4UH to 4WL.

The transistor 4UH is a U-phase high-side transistor. The transistor 4UL is a U-phase low-side transistor. The transistors 4UH and 4UL are connected in series between the P terminal T16 and the NU terminal T20. Specifically, a drain of the transistor 4UH is connected to the P terminal T16. A source of the transistor 4UH and a drain of the transistor 4UL are connected to each other and connected to the U terminal T17. A source of the transistor 4UL is connected to the NU terminal T20. The transistors 4UH and 4UL form a U-phase switching arm.

The transistor 4VH is a V-phase high-side transistor. The transistor 4VL is a V-phase low-side transistor. The transistors 4VH and 4VL are connected in series between the P terminal T16 and the NV terminal T21. Specifically, a drain of the transistor 4VH is connected to the P terminal T16. A source of the transistor 4VH and a drain of the transistor 4VL are connected to each other and connected to the V terminal T18. A source of the transistor 4VL is connected to the NV terminal T21. The transistors 4VH and 4VL form a V-phase switching arm.

The transistor 4WH is a W-phase high-side transistor. The transistor 4WL is a W-phase low-side transistor. The transistors 4WH and 4WL are connected in series between the P terminal T16 and the NW terminal T22. Specifically, a drain of the transistor 4WH is connected to the P terminal T16. A source of the transistor 4WH and a drain of the transistor 4WL are connected to each other and connected to the W terminal T19. A source of the transistor 4WL is connected to the NW terminal T22. The transistors 4WH and 4WL form a W-phase switching arm.

An output signal (gate voltage) is supplied from the drive circuit 2 to a gate of each of the transistors 4UH, 4VH, and 4WH. An output signal (gate voltage) is supplied from the drive circuit 3 to a gate of each of the transistors 4UL, 4VL, and 4WL. When the gate voltage is applied to the gate and a gate-source voltage becomes greater than a threshold voltage of the transistor, the transistor is turned on.

The freewheeling diodes 5UH to 5WL are diodes connected in reverse-parallel to the transistors 4UH to 4WL, respectively. A cathode of each freewheeling diode is connected to the drain of the corresponding transistor. An anode of each freewheeling diode is connected to the source of the corresponding transistor.

The diode 6U, together with the capacitor Cbu, constitutes a U-phase bootstrap circuit. A cathode of the diode 6U is connected to the VBU terminal T1, and an anode of the diode 6U is connected to the HVCC terminal T7 via a resistor element in the drive circuit 2. The diode 6V, together with the capacitor Cbv, constitutes a V-phase bootstrap circuit. A cathode of the diode 6V is connected to the VBV terminal T2, and an anode of the diode 6V is connected to the HVCC terminal T7 via a resistor element in the drive circuit 2. The diode 6W, together with the capacitor Cbw, constitutes a W-phase bootstrap circuit. A cathode of the diode 6W is connected to the VBW terminal T3, and an anode of the diode 6W is connected to the HVCC terminal T7 via a resistor element in the drive circuit 2.

Figure 3:
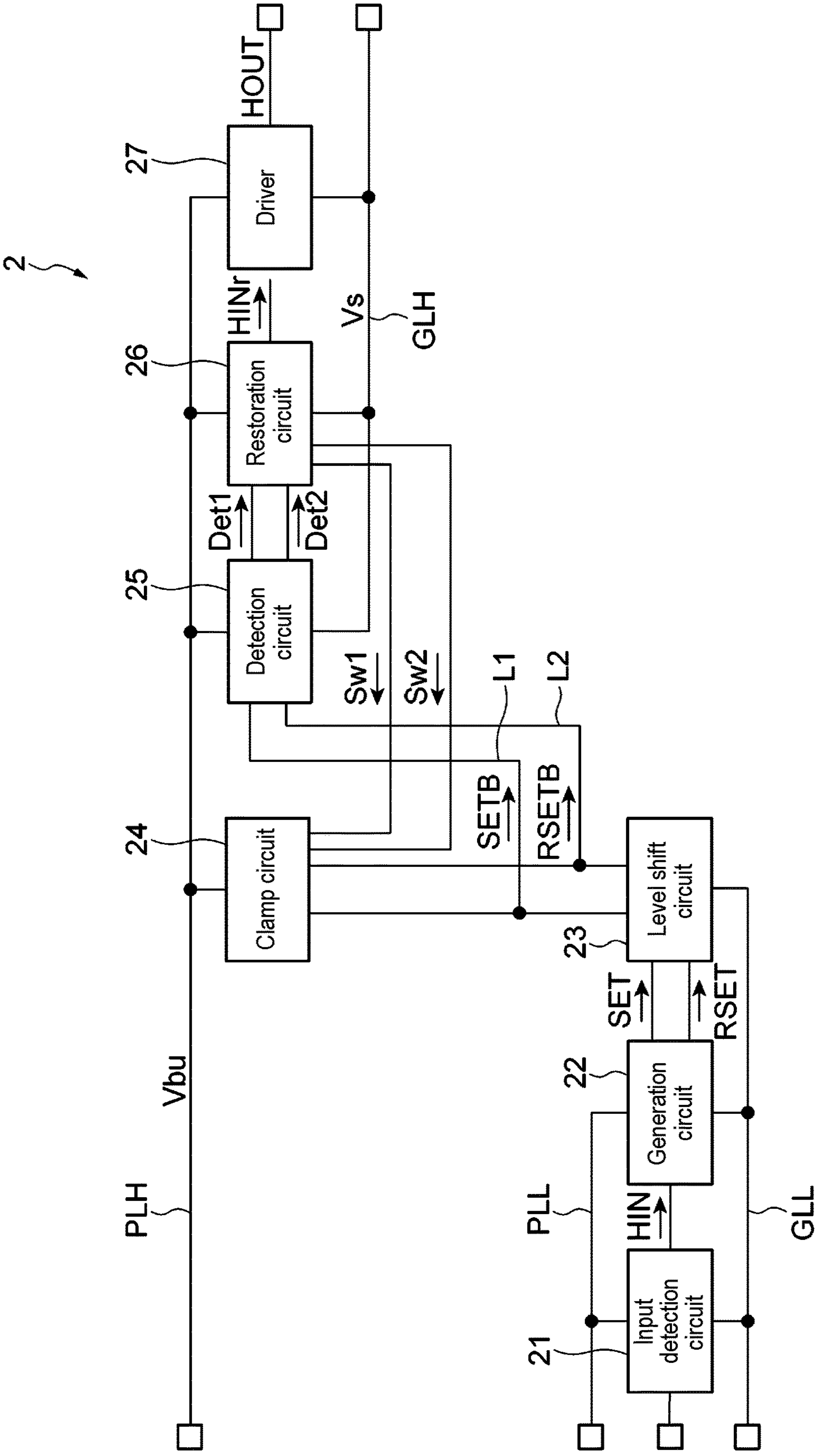
FIG. 3 is a diagram for schematically explaining the drive circuit for the high-side transistor shown in FIG. 1.
Figure 4:
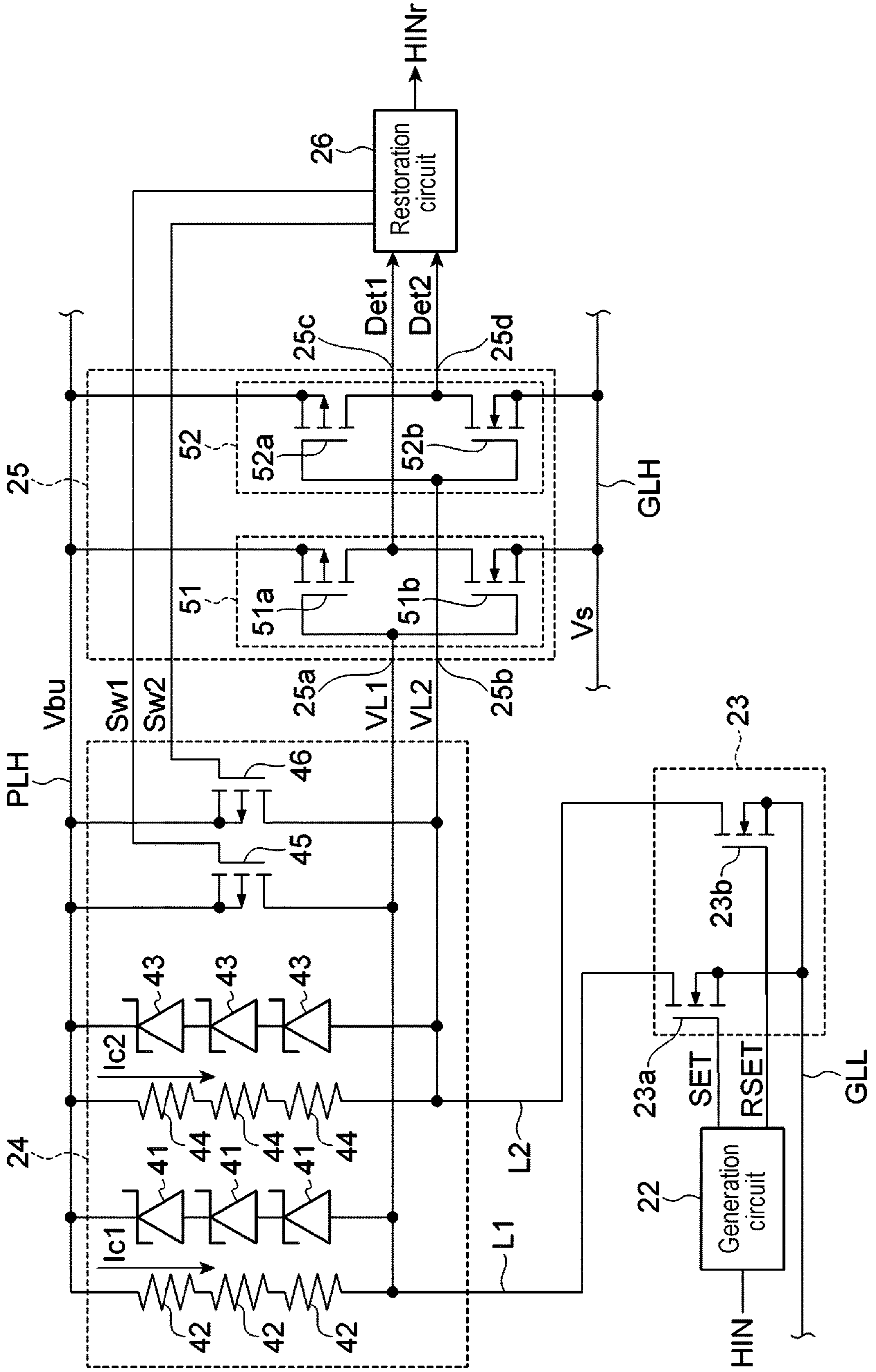
FIG. 4 is a diagram showing an exemplary circuit configuration of a level shift circuit, a clamp circuit, and a detection circuit shown in FIG. 3.

Next, a configuration of the drive circuit 2 will be described with reference to FIG. 3 and FIG. 4. FIG. 3 is a diagram for explaining the high-side transistor drive circuit shown in FIG. 1. FIG. 4 is a diagram showing an exemplary circuit configuration of a level shift circuit, a clamp circuit, and a detection circuit shown in FIG. 3. As shown in FIG. 3, the drive circuit 2 includes an input detection circuit 21, a generation circuit 22, a level shift circuit 23, a clamp circuit 24, a detection circuit 25, a restoration circuit 26, and a driver 27. In addition, FIG. 3 shows only circuitry for driving the transistor 4UH. Circuitry for driving the transistor 4VH and circuitry for driving the transistor 4WH also have the same configuration as the circuitry for driving the transistor 4UH.

The input detection circuit 21 is a circuit that detects the input signal Hinu. For example, the input detection circuit 21 detects the input signal Hinu of a voltage level (e.g., 3 V or 5 V) in the MCU 100, and generates an input signal HIN by converting the voltage level of the input signal Hinu to a low-side voltage level. The input signal HIN is a signal having a low-side power supply potential as a high level and having the low-side ground potential as a low level. The low-side power supply potential is, for example, 15 V to 18 V. The input detection circuit 21 outputs the input signal HIN to the generation circuit 22.

The generation circuit 22 is a pulse generator that generates a pulse signal SET (first pulse signal) and a pulse signal RSET (second pulse signal) based on the input signal HIN. The generation circuit 22 generates a plurality of consecutive high-level pulse signals SET in response to a rising edge (first edge) of the input signal HIN, and generates a plurality of consecutive high-level pulse signals RSET in response to a falling edge (second edge) of the input signal HIN. In the present embodiment, the generation circuit 22 generates three consecutive pulse signals SET in response to detecting the rising edge of the input signal HIN, and generates three consecutive pulse signals RSET in response to detecting the falling edge of the input signal HIN.

Pulse widths of the pulse signals SET and RSET are set so that the pulse signals SET and RSET do not have a high level at the same time. An interval between two adjacent pulse signals SET among the plurality of consecutive pulse signals SET is, for example, longer than a first delay time to be described later and shorter than a sum of the first delay time and a time constant of an edge detection circuit 71 (see FIG. 5). An interval between two adjacent pulse signals RSET among the plurality of consecutive pulse signals RSET is, for example, longer than a second delay time to be described later and shorter than a sum of the second delay time and a time constant of an edge detection circuit 81 (see FIG. 5). The generation circuit 22 outputs the pulse signals SET and RSET to the level shift circuit 23.

The level shift circuit 23 is a level shifter that converts voltage levels of the pulse signals SET and RSET to a high-side voltage level. The level shift circuit 23 generates a low-level pulse signal SETB (set pulse signal) by converting the voltage level of the high-level pulse signal RSET to a high-side voltage level. The level shift circuit 23 generates a low-level pulse signal RSETB (reset pulse signal) by converting the voltage level of the high-level pulse signal RSET to a high-side voltage level.

A high level of the high-side (high-side power supply potential) is defined by a voltage Vbu supplied to a power supply line PLH, and a low level of the high-side (high-side ground potential) is defined by a voltage Vs supplied to a ground line GLH. The power supply line PLH is a wiring that supplies the high-side power supply voltage (the voltage Vbu). The ground line GLH is connected to the U terminal T17 and is a wiring that supplies the high-side ground potential (the voltage Vs). In addition, the voltage Vs is also referred to as an offset voltage for floating control.

The pulse signals SETB and RSETB are signals that set the high-side power supply potential (the voltage Vbu) to a high level and the high-side ground potential (the voltage Vs) to a low level. In other words, each time the level shift circuit 23 receives the high-level pulse signal SET, the level shift circuit 23 converts the pulse signal SET to the low-level pulse signal SETB and outputs the pulse signal SETB to a transmission line L1 (first transmission line). Each time the level shift circuit 23 receives the high-level pulse signal RSET, the level shift circuit 23 converts the pulse signal RSET to the low-level pulse signal RSETB and outputs the pulse signal RSETB to a transmission line L2 (second transmission line).

As shown in FIG. 4, the level shift circuit 23 includes a transistor 23*a* and a transistor 23*b*. The transistors 23*a* and 23*b* may be MOSFETs or bipolar transistors. In the present embodiment, N-channel MOSFETs are exemplified as the transistors 23*a* and 23*b*. A source of the transistor 23*a* and a source of the transistor 23*b* are connected to the ground line GLL. A drain of the transistor 23*a* is connected to the transmission line L1, and a drain of the transistor 23*b* is connected to the transmission line L2. A gate of the transistor 23*a* is supplied with the pulse signal SET from the generation circuit 22. A gate of the transistor 23*b* is supplied with the pulse signal RSET from the generation circuit 22.

When the pulse signal SET is supplied to the gate of the transistor 23*a* and a gate-source voltage of the transistor 23*a* becomes greater than a threshold voltage of the transistor 23*a*, the transistor 23*a* is turned on. This causes a current to flow from the drain to the source of the transistor 23*a* to generate the low-level pulse signal SETB on the transmission line L1. Similarly, when the pulse signal RSET is supplied to the gate of the transistor 23*b* and a gate-source voltage of the transistor 23*b* becomes greater than a threshold voltage of the transistor 23*b*, the transistor 23*b* is turned on. This causes a current to flow from the drain to the source of the transistor 23*b* to generate the low-level pulse signal RSETB on the transmission line L2.

The clamp circuit 24 is a circuit that clamps a voltage VL1 (first voltage) of the transmission line L1 and a voltage VL2 (second voltage) of the transmission line L2. As shown in FIG. 4, the clamp circuit 24 includes a plurality of Zener diodes 41, a plurality of resistor elements 42, a plurality of Zener diodes 43, a plurality of resistor elements 44, a switching element 45 (first switching element), and a switching element 46 (second switching element).

The Zener diodes 41 are connected in series between the power supply line PLH and the transmission line L1. Specifically, a cathode of the Zener diode 41 in a first stage is connected to the power supply line PLH. Cathodes of the Zener diodes 41 in second and subsequent stages are connected to an anode of the Zener diode 41 in a preceding stage. An anode of the Zener diode 41 in the final stage (a third stage in the example of FIG. 4) is connected to the transmission line L1. The Zener diodes 41 set the voltage VL1 to a value obtained by subtracting a sum of Zener voltages of the Zener diodes 41 from the voltage Vbu. The number of Zener diodes 41 is determined according to a desired maximum value of the voltage VL1. In the example of FIG. 4, the clamp circuit 24 includes three Zener diodes 41, but may include one Zener diode 41, two Zener diodes 41, or four or more Zener diodes 41.

The resistor elements 42 are connected in series between the power supply line PLH and the transmission line L1. In the example of FIG. 4, the clamp circuit 24 includes three resistor elements 42, but may include one resistor element 42, two resistor elements 42, or four or more resistor elements 42. A charging current Ic1 for charging the transmission line L1 flows from the power supply line PLH to the transmission line L1 through the Zener diodes 41 and the resistor elements 42. When a difference between the voltage Vbu and the voltage VL1 becomes smaller than the sum of the Zener voltages of the Zener diodes 41, no current flows through the Zener diodes 41. Therefore, the charging current Ic1 flows through the resistor elements 42, causing the voltage VL1 to reach the voltage Vbu. A combined resistance value of the resistor elements 42 is set to charge the voltage VL1 quickly within a range in which the transistor 23*a* can set the voltage VL1 to a low level.

The Zener diodes 43 are connected in series between the power supply line PLH and the transmission line L2. Specifically, a cathode of the Zener diode 43 in a first stage is connected to the power supply line PLH. Cathodes of the Zener diodes 43 in second and subsequent stages are connected to an anode of the Zener diode 43 in a preceding stage. An anode of the Zener diode 43 in the final stage (a third stage in the example of FIG. 4) is connected to the transmission line L2. The Zener diodes 43 set the voltage VL2 to a value obtained by subtracting a sum of Zener voltages of the Zener diodes 43 from the voltage Vbu. The number of Zener diodes 43 is determined according to a desired maximum value of the voltage VL2. In the example of FIG. 4, the clamp circuit 24 includes three Zener diodes 43, but may include one Zener diode 43, two Zener diodes 43, or four or more Zener diodes 43.

The resistor elements 44 are connected in series between the power supply line PLH and the transmission line L2. In the example of FIG. 4, the clamp circuit 24 includes three resistor elements 44, but may include one resistor element 44, two resistor elements 44, or four or more resistor elements 44. A charging current Ic2 for charging the transmission line L2 flows from the power supply line PLH to the transmission line L2 through the Zener diodes 43 and the resistor elements 44. When a difference between the voltage Vbu and the voltage VL2 becomes smaller than the sum of the Zener voltages of the Zener diodes 43, no current flows through the Zener diodes 43. Therefore, the charging current Ic2 flows through the resistor elements 44, causing the voltage VL2 to reach the voltage Vbu. A combined resistance value of the resistor elements 44 is set to charge the voltage VL2 quickly within a range in which the transistor 23*b* can set the voltage VL2 to a low level.

Each of the switching elements 45 and 46 is an element that can be switched between electrically on and off states. That is, each of the switching elements 45 and 46 can be switched between an on state in which both ends thereof are in a conductive state and an off state in which both ends thereof are in a cut-off state. As such switching elements, for example, MOSFETs and bipolar transistors are used. In the present embodiment, P-channel MOSFETs are exemplified as the switching elements 45 and 46.

The switching element 45 is provided between the power supply line PLH and the transmission line L1. The switching element 45 is configured to be switchable between an on state in which the power supply line PLH and the transmission line L1 are electrically connected, and an off state in which the power supply line PLH and the transmission line L1 are disconnected. The switching element 45 switches between the on state and the off state in response to a switching signal Sw1 output from the restoration circuit 26. Specifically, a source of the switching element 45 is connected to the power supply line PLH. A drain of the switching element 45 is connected to the transmission line L1. The switching signal Sw1 is input from the restoration circuit 26 to a gate of the switching element 45.

The switching element 46 is provided between the power supply line PLH and the transmission line L2. The switching element 46 is configured to be switchable between an on state in which the power supply line PLH and the transmission line L2 are electrically connected, and an off state in which the power supply line PLH and the transmission line L2 are disconnected. The switching element 46 switches between the on state and the off state in response to a switching signal Sw2 output from the restoration circuit 26. Specifically, a source of the switching element 46 is connected to the power supply line PLH. A drain of the switching element 46 is connected to the transmission line L2. The switching signal Sw2 is input to a gate of the switching element 46 from the restoration circuit 26.

The detection circuit 25 is a circuit that detects the pulse signals SETB and RSETB. The detection circuit 25 outputs a high-level detection signal Det1 (first detection signal) in response to detecting that the voltage VL1 is at a low level, and outputs a high-level detection signal Det2 (second detection signal) in response to detecting that the voltage VL2 is at a low level. The detection signals Det1 and Det2 are signals having the high-side power supply potential as a high level and having the high-side ground potential as a low level.

As shown in FIG. 4, the detection circuit 25 includes an input terminal 25*a*, an input terminal 25*b*, an output terminal 25*c*, and an output terminal 25*d*. The input terminal 25*a* is connected to the transmission line L1. The input terminal 25*b* is connected to the transmission line L2. The output terminal 25*c* outputs the detection signal Det1 to the restoration circuit 26. The output terminal 25*d* outputs the detection signal Det2 to the restoration circuit 26. The detection circuit 25 includes a signal detection circuit 51 and a signal detection circuit 52.

The signal detection circuit 51 is a circuit that detects the pulse signal SETB. When the signal detection circuit 51 detects that the voltage VL1 is at a low level, the signal detection circuit 51 outputs the high-level detection signal Det1 to the restoration circuit 26. A threshold voltage Vth1 (see FIG. 7) of the signal detection circuit 51 is set to a voltage between the voltage Vbu and the voltage Vs. The signal detection circuit 51 outputs the high-level detection signal Det1 when the voltage VL1 is lower than the threshold voltage Vth1, and outputs the low-level detection signal Det1 when the voltage VL1 is higher than the threshold voltage Vth1. In the present embodiment, the signal detection circuit 51 is an inverter circuit, and includes a transistor 51*a* and a transistor 51*b*.

The transistor 51*a* is, for example, a P-channel MOSFET. The transistor 51*b* is, for example, an N-channel MOSFET. The transistors 51*a* and 51*b* are connected in series between the power supply line PLH and the ground line GLH. Specifically, a source of the transistor 51*a* is connected to the power supply line PLH. A drain of the transistor 51*a* and a drain of the transistor 51*b* are connected to each other and connected to the output terminal 25*c*. A source of the transistor 51*b* is connected to the ground line GLH. A gate of the transistor 51*a* and a gate of the transistor 51*b* are connected to each other and connected to the input terminal 25*a*.

The signal detection circuit 52 is a circuit that detects the pulse signal RSETB. When the signal detection circuit 52 detects that the voltage VL2 is at a low level, the signal detection circuit 52 outputs the high-level detection signal Det2 to the restoration circuit 26. A threshold voltage Vth2 (see FIG. 7) of the signal detection circuit 52 is set to a voltage between the voltage Vbu and the voltage Vs. The threshold voltage Vth2 may be the same as the threshold voltage Vth1, or may be different from the threshold voltage Vth1. The signal detection circuit 52 outputs the high-level detection signal Det2 when the voltage VL2 is lower than the threshold voltage Vth2, and outputs the low-level detection signal Det2 when the voltage VL2 is higher than the threshold voltage Vth2. In the present embodiment, the signal detection circuit 52 is an inverter circuit, and includes a transistor 52*a* and a transistor 52*b*.

The transistor 52*a* is, for example, a P-channel MOSFET. The transistor 52*b* is, for example, an N-channel MOSFET. The transistors 52*a* and 52*b* are connected in series between the power supply line PLH and the ground line GLH. Specifically, a source of the transistor 52*a* is connected to the power supply line PLH. A drain of the transistor 52*a* and a drain of the transistor 52*b* are connected to each other and connected to the output terminal 25*d*. A source of the transistor 52*b* is connected to the ground line GLH. A gate of the transistor 52*a* and a gate of the transistor 52*b* are connected to each other and connected to the input terminal 25*b*.

The restoration circuit 26 is a circuit that restores the input signal HIN. The restoration circuit 26 restores the input signal HIN based on the detection signals Det1 and Det2, and outputs a restored input signal HINr. The input signal HINr is a signal having the high-side power supply potential as a high level and having the high-side ground potential as a low level. The restoration circuit 26 outputs a low-level switching signal Sw1, in response to a first detection signal Det1 among a plurality of high-level pulse-shaped detection signals Det1 that are output consecutively from the detection circuit 25, to set the switching element 45 to an on state. The switching signal Sw1 is a signal having the high-side power supply potential as a high level and having the high-side ground potential as a low level. More specifically, the restoration circuit 26 switches the switching signal Sw1 from high level to low level in response to detecting a rising edge of the first detection signal Det1, and switches the switching signal Sw1 from low level to high level in response to detecting a falling edge of the first detection signal Det1.

In addition, when two high-level pulse-shaped detection signals Det1 are output consecutively, it means that a time interval from a falling edge of a preceding high-level pulse-shaped detection signal Det1 to a rising edge of a next high-level pulse-shaped detection signal Det1 is shorter than a predetermined time. The predetermined time is, for example, the sum of the first delay time to be described later and the time constant of the edge detection circuit 71 (see FIG. 5). A k-th high-level pulse-shaped detection signal Det1 from the head of the plurality of consecutive high-level pulse-shaped detection signals Det1 is simply referred to as a "k-th detection signal Det1," where k is a positive integer.

The restoration circuit 26 restores a rising edge of the input signal HIN in response to a second detection signal Det1 among the plurality of high-level pulse-shaped detection signals Det1 output consecutively from the detection circuit 25. In other words, the restoration circuit 26 generates a rising edge of the input signal HINr in response to detecting a rising edge of the second detection signal Det1. The restoration circuit 26 ignores (invalidates) third and subsequent detection signals Det1 (rising and falling edges of the third and subsequent detection signals Det1) among the plurality of high-level detection signals Det1 output consecutively from the detection circuit 25.

The restoration circuit 26 outputs a low-level switching signal Sw2, in response to a first detection signal Det2 among a plurality of high-level pulse-shaped detection signals Det2 that are output consecutively from the detection circuit 25, to set the switching element 46 to an on state. The switching signal Sw2 is a signal having the high-side power supply potential as a high level and having the high-side ground potential as a low level. More specifically, the restoration circuit 26 switches the switching signal Sw2 from high level to low level in response to detecting a rising edge of the first detection signal Det2, and switches the switching signal Sw2 from low level to high level in response to detecting a falling edge of the first detection signal Det2.

In addition, when two high-level pulse-shaped detection signals Det2 are output consecutively, it means that a time interval from a falling edge of a preceding high-level pulse-shaped detection signal Det2 to a rising edge of a next high-level pulse-shaped detection signal Det2 is shorter than a predetermined time. The predetermined time is, for example, the sum of the second delay time to be described later and the time constant of the edge detection circuit 81 (see FIG. 5). A k-th high-level pulse-shaped detection signal Det2 from the head of the plurality of consecutive high-level pulse-shaped detection signals Det2 is simply referred to as a "k-th detection signal Det2."

The restoration circuit 26 restores a falling edge of the input signal HIN in response to a second detection signal Det2 among the plurality of high-level pulse-shaped detection signals Det2 output consecutively from the detection circuit 25. In other words, the restoration circuit 26 generates a falling edge of the input signal HINr in response to detecting a rising edge of the second detection signal Det2. The restoration circuit 26 ignores (invalidates) third and subsequent detection signals Det (rising and falling edges of the third and subsequent detection signals Det2) among the plurality of high-level detection signals Det2 output consecutively from the detection circuit 25. An example of the restoration circuit 26 will be described later.

The driver 27 generates an output signal HOUT based on the input signal HINr output from the restoration circuit 26, and outputs the output signal HOUT to a gate of the transistor 4UH. The output signal HOUT is a drive signal that drives the transistor 4UH. When the output signal HOUT is applied to the gate of the transistor 4UH and a gate-source voltage of the transistor 4UH becomes greater than a threshold voltage of the transistor 4UH, the transistor 4UH is turned on.

Figure 5:
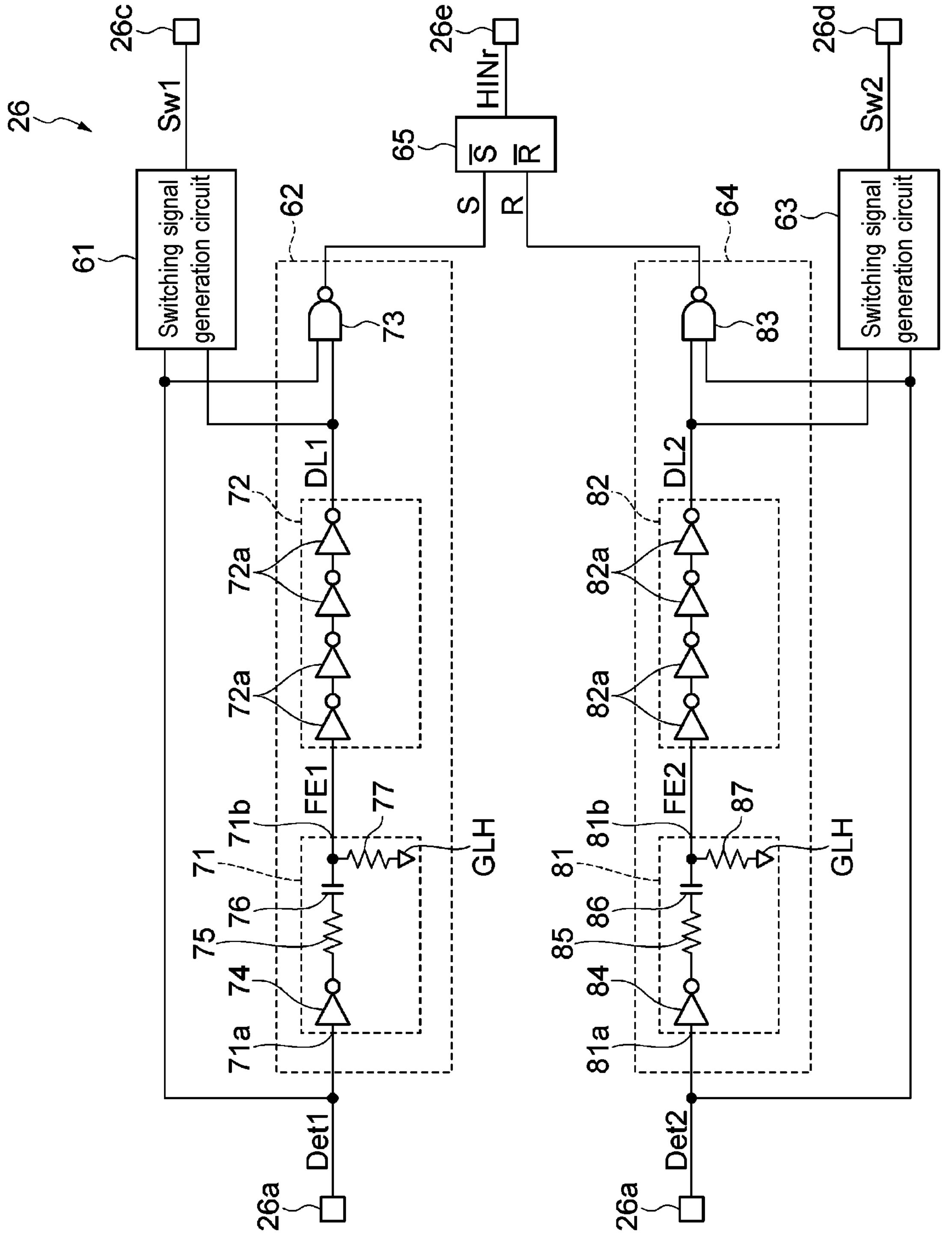
FIG. 5 is a diagram showing an exemplary circuit configuration of a restoration circuit shown in FIG. 3.

Next, a circuit configuration of the restoration circuit 26 will be described with reference to FIG. 5. FIG. 5 is a diagram showing an exemplary circuit configuration of the restoration circuit shown in FIG. 3.

As shown in FIG. 5, the restoration circuit 26 has an input terminal 26*a*, an input terminal 26*b*, an output terminal 26*c*, an output terminal 26*d*, and an output terminal 26*c*. The input terminal 26*a* is connected to the output terminal 25*c* of the detection circuit 25. The detection signal Det1 is input to the input terminal 26*a*. The input terminal 26*b* is connected to the output terminal 25*d* of the detection circuit 25. The detection signal Det2 is input to the input terminal 26*b*. The output terminal 26*c* is connected to the gate of the switching element 45 and outputs the switching signal Sw1 to the gate of the switching element 45. The output terminal 26*d* is connected to the gate of the switching element 46 and outputs the switching signal Sw2 to the gate of the switching element 46. The output terminal 26*e* outputs the input signal HINr to the driver 27.

The restoration circuit 26 includes a switching signal generation circuit 61, a set signal generation circuit 62, a switching signal generation circuit 63, a reset signal generation circuit 64, and an input signal generation circuit 65.

The switching signal generation circuit 61 is a circuit that generates the switching signal Sw1. The switching signal generation circuit 61 generates a low-level switching signal Sw1 in response to the first detection signal Det1 among the plurality of high-level pulse-shaped detection signals Det1 output consecutively from the detection circuit 25. The switching signal generation circuit 61 outputs the low-level switching signal Sw1 to the output terminal 26*c* while the first detection signal Det1 is at a high level. The switching signal generation circuit 61 maintains the switching signal Sw1 at a high level even when the switching signal generation circuit 61 receives the second and subsequent detection signals Det1.

The switching signal generation circuit 61 is configured by, for example, a NAND circuit. The switching signal generation circuit 61 performs a NAND operation on, for example, the detection signal Det1 and a signal (first mask signal) that is at a low level over an interval from a rising edge of a first delayed signal DL1 to a falling edge of a last delayed signal DL1 among a plurality of high-level pulse-shaped delayed signals DL1 output consecutively from a delay circuit 72 to be described later, and outputs a result of the NAND operation as the switching signal Sw1. The first mask signal is generated by a known method, and detailed explanation thereof will be omitted here.

The set signal generation circuit 62 is a circuit that generates a set signal S. The set signal generation circuit 62 generates a low-level set signal S in response to the second detection signal Det1 among a plurality of high-level pulse-shaped detection signals Det1 output consecutively from the detection circuit 25. The set signal generation circuit 62 includes the edge detection circuit 71, the delay circuit 72, and a NAND circuit 73.

The edge detection circuit 71 is a circuit that detects a falling edge of the detection signal Det1. When the edge detection circuit 71 detects the falling edge of the detection signal Det1, the edge detection circuit 71 generates a high-level pulse-shaped output signal FE1 and outputs the output signal FE1 to the delay circuit 72. The edge detection circuit 71 includes an input terminal 71*a* and an output terminal 71*b*. The input terminal 71*a* is connected to the input terminal 26*a*. The output terminal 71*b* is connected to an input terminal of the delay circuit 72 and outputs the output signal FE1 to the delay circuit 72. The edge detection circuit 71 includes an inverter circuit 74, a resistor element 75, a capacitor 76, and a resistor element 77.

The inverter circuit 74 is a circuit that inverts a voltage level of the detection signal Det1. An input terminal of the inverter circuit 74 is connected to the input terminal 71*a*. An output terminal of the inverter circuit 74 is connected to the output terminal 71*b* via the resistor element 75 and the capacitor 76 connected in series. Specifically, one end of the resistor element 75 is connected to the output terminal of the inverter circuit 74, and the other end of the resistor element 75 is connected to one end of the capacitor 76. The other end of the capacitor 76 is connected to the output terminal 71*b*. One end of the resistor element 77 is connected to the other end of the capacitor 76 (the output terminal 71*b*), and the other end of the resistor element 77 is connected to the ground line GLH.

The capacitor 76 and the resistor element 77 form a differential circuit which differentiates an output signal of the inverter circuit 74. Therefore, a high-level pulse-shaped signal is generated in response to the falling edge of the detection signal Det1, and is output as the output signal FE1. In addition, the differential circuit generates a negative-polarity pulse-shaped signal in response to the rising edge of the detection signal Det1, but this signal is removed by a diode (not shown) or the like. In order to obtain a desired time constant, a resistance value of the resistor element 75, a capacitance of the capacitor 76, and a resistance value of the resistor element 77 are set. The time constant of the above-mentioned differential circuit (the time constant of the edge detection circuit 71) is determined by a product of a sum of the resistance values of the resistor elements 75 and 77 and the capacitance of the capacitor 76.

The delay circuit 72 is a circuit that generates the delayed signal DL1 obtained by delaying the output signal FE1. The delay circuit 72 outputs the delayed signal DL1 to the NAND circuit 73. The delay circuit 72 includes an even number of inverter circuits 72*a* connected in series. The number of inverter circuits 72*a* included in the delay circuit 72 is appropriately determined according to a desired first delay time.

The NAND circuit 73 is a circuit that generates a low-level set signal S in response to rising edges of the second and subsequent detection signals Det1. The NAND circuit 73 has two non-inverting input terminals. One non-inverting input terminal of the NAND circuit 73 is connected to the input terminal 26*a*. The other non-inverting input terminal of the NAND circuit 73 is connected to an output terminal of the delay circuit 72. That is, the NAND circuit 73 performs a NAND operation on the detection signal Det1 and the delayed signal DL1, and outputs a result of the NAND operation as the set signal S to the input signal generation circuit 65.

The switching signal generation circuit 63 is a circuit that generates the switching signal Sw2. The switching signal generation circuit 63 generates a low-level switching signal Sw2 in response to the first detection signal Det2 among the plurality of high-level pulse-shaped detection signals Det2 output consecutively from the detection circuit 25. The switching signal generation circuit 63 outputs the low-level switching signal Sw2 to the output terminal 26*d* while the first detection signal Det2 is at a high level. The switching signal generation circuit 63 maintains the switching signal Sw2 at a high level even when the switching signal generation circuit 63 receives the second and subsequent detection signals Det2.

The switching signal generation circuit 63 is configured by, for example, a NAND circuit. The switching signal generation circuit 63 performs a NAND operation on, for example, the detection signal Det2 and a signal (second mask signal) that is at a low level over an interval from a rising edge of a first delayed signal DL2 to a falling edge of a last delayed signal DL2 among the plurality of high-level pulse-shaped delayed signals DL2 output consecutively from a delay circuit 82 to be described later, and outputs a result of the NAND operation as the switching signal Sw2. The second mask signal is generated by a known method, and detailed explanation thereof will be omitted here.

The reset signal generation circuit 64 is a circuit that generates a reset signal R. The reset signal generation circuit 64 generates a low-level reset signal R in response to the second detection signal Det2 among the plurality of high-level pulse-shaped detection signals Det2 output consecutively from the detection circuit 25. The reset signal generation circuit 64 includes the edge detection circuit 81, the delay circuit 82, and a NAND circuit 83.

The edge detection circuit 81 is a circuit that detects a falling edge of the detection signal Det2. When the edge detection circuit 81 detects the falling edge of the detection signal Det2, the edge detection circuit 81 generates a high-level pulse-shaped output signal FE2 and outputs the output signal FE2 to the delay circuit 82. The edge detection circuit 81 includes an input terminal 81*a* and an output terminal 81*b*. The input terminal 81*a* is connected to the input terminal 26*b*. The output terminal 81*b* is connected to an input terminal of the delay circuit 82 and outputs the output signal FE2 to the delay circuit 82. The edge detection circuit 81 includes an inverter circuit 84, a resistor element 85, a capacitor 86, and a resistor element 87.

The inverter circuit 84 is a circuit that inverts a voltage level of the detection signal Det2. An input terminal of the inverter circuit 84 is connected to the input terminal 81*a*. An output terminal of the inverter circuit 84 is connected to the output terminal 81*b* via the resistor element 85 and the capacitor 86 connected in series. Specifically, one end of the resistor element 85 is connected to the output terminal of the inverter circuit 84, and the other end of the resistor element 85 is connected to one end of the capacitor 86. The other end of the capacitor 86 is connected to the output terminal 81*b*. One end of the resistor element 87 is connected to the other end (the output terminal 81*b*) of the capacitor 86, and the other end of the resistor element 87 is connected to the ground line GLH.

The capacitor 86 and the resistor element 87 form a differential circuit which differentiates an output signal of the inverter circuit 84. Therefore, a high-level pulse-shaped signal is generated in response to the falling edge of the detection signal Det2, and is output as the output signal FE2. In addition, the differential circuit generates a negative-polarity pulse-shaped signal in response to the rising edge of the detection signal Det2, but this signal is removed by a diode (not shown) or the like. In order to obtain a desired time constant, a resistance value of the resistor element 85, a capacitance of the capacitor 86, and a resistance value of the resistor element 87 are set. The time constant of the above-mentioned differential circuit (the time constant of the edge detection circuit 81) is determined by a product of a sum of the resistance values of the resistor elements 85 and 87 and the capacitance of the capacitor 86.

The delay circuit 82 is a circuit that generates the delayed signal DL2 obtained by delaying the output signal FE2. The delay circuit 82 outputs the delayed signal DL2 to the NAND circuit 83. The delay circuit 82 includes an even number of inverter circuits 82*a* connected in series. The number of inverter circuits 82*a* included in the delay circuit 82 is appropriately determined according to a desired second delay time.

The NAND circuit 83 is a circuit that generates a low-level reset signal R in response to rising edges of the second and subsequent detection signals Det2. The NAND circuit 83 has two non-inverting input terminals. One non-inverting input terminal of the NAND circuit 83 is connected to the input terminal 26*b*. The other non-inverting input terminal of the NAND circuit 83 is connected to an output terminal of the delay circuit 82. That is, the NAND circuit 83 performs a NAND operation on the detection signal Det2 and the delayed signal DL2, and outputs a result of the NAND operation as the reset signal R to the input signal generation circuit 65.

The input signal generation circuit 65 is a circuit that generates the input signal HINr in response to the set signal S and the reset signal R. The input signal generation circuit 65 is configured by, for example, an RS flip-flop. The input signal generation circuit 65 has a low-active set terminal, a low-active reset terminal, and a non-inverting output terminal. The set terminal of the input signal generation circuit 65 is connected to an output terminal of the NAND circuit 73, and the set signal S is input from the NAND circuit 73 to the set terminal. The reset terminal of the input signal generation circuit 65 is connected to an output terminal of the NAND circuit 83, and the reset signal R is input from the NAND circuit 83 to the reset terminal. The output terminal of the input signal generation circuit 65 is connected to the output terminal 26*c* and outputs the input signal HINr.

When the input signal HINr is at a low level, the input signal generation circuit 65 switches the input signal HINr from the low level to a high level in response to the low-level set signal S being input to the set terminal. When the input signal HINr is at a high level, the input signal generation circuit 65 maintains the input signal HINr at the high level even when the low-level set signal S is input to the set terminal. When the input signal HINr is at a high level, the input signal generation circuit 65 switches the input signal HINr from the high level to a low level in response to the low-level reset signal R being input to the reset terminal. When the input signal HINr is at a low level, the input signal generation circuit 65 maintains the input signal HINr at the low level even when the low-level reset signal R is input to the reset terminal.

Figure 6:
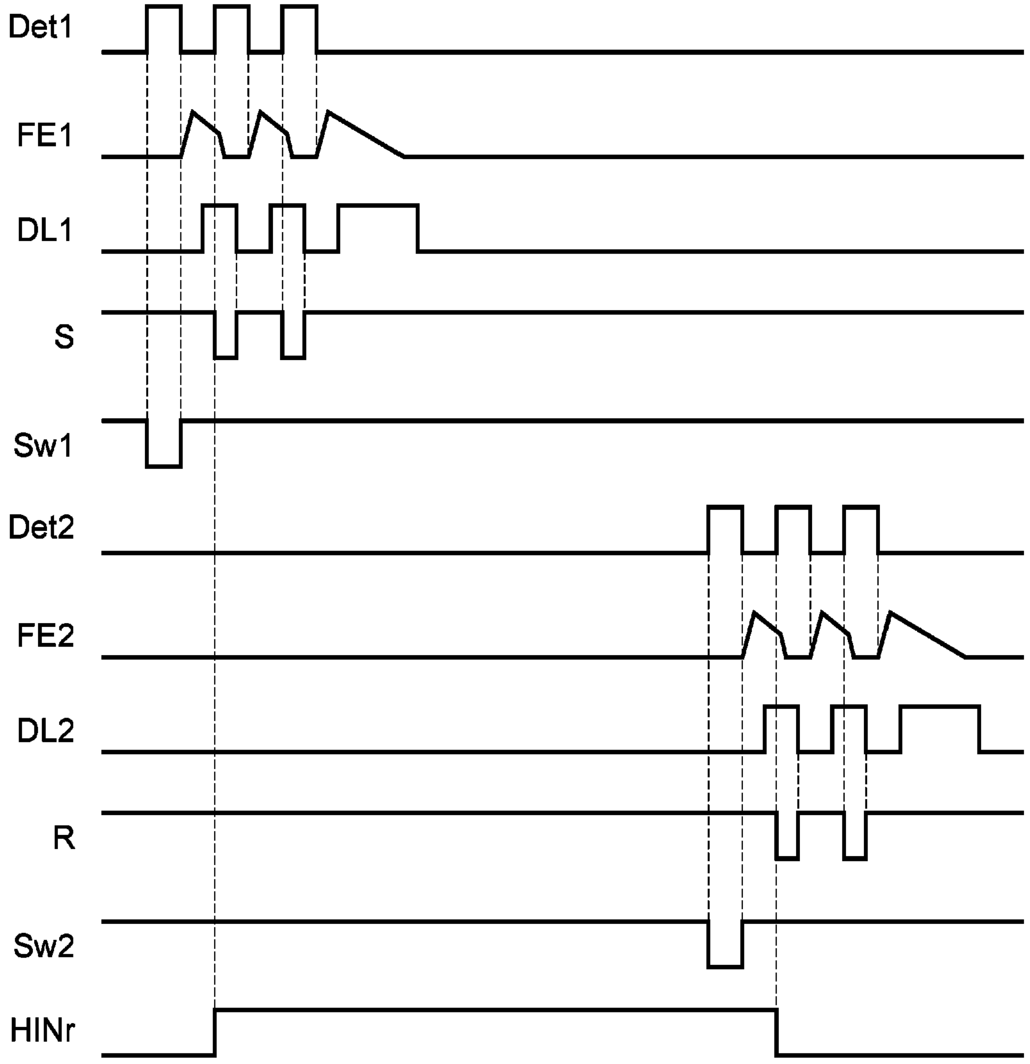
FIG. 6 is a diagram for explaining an operation of the restoration circuit shown in FIG. 5.

Next, an operation of the restoration circuit 26 will be described with further reference to FIG. 6. FIG. 6 is a diagram for explaining an operation of the restoration circuit shown in FIG. 5. In the following description, a case where the voltage Vbu of the power supply line PLH is at a high level and the voltage Vs is at a low level may be referred to as a "Vb-Vs reference." In other words, the voltage of the Vb-Vs reference is a voltage obtained by subtracting the voltage Vs from an actual voltage. Each signal in FIG. 6 is represented based on the Vb-Vs reference. Here, an operation of the restoration circuit 26 will be described when three consecutive high-level pulse-shaped detection signals Det1 are output from the detection circuit 25, and then three consecutive high-level pulse-shaped detection signals Det2 are output from the detection circuit 25.

As shown in FIG. 6, when a rising edge of the normal input signal HIN is input, the three high-level pulse-shaped detection signals Det1 are output sequentially from the detection circuit 25 (the signal detection circuit 51). First, when the restoration circuit 26 receives the first detection signal Det1, since the first mask signal is at a high level, the switching signal generation circuit 61 outputs the low-level switching signal Sw1 while the detection signal Det1 is at a high level. At this time, since the delayed signal DL1 is at the low level, even when the high-level detection signal Det1 is input to the NAND circuit 73, the set signal S maintains the high level.

Thereafter, in response to a falling edge of the first detection signal Det1, a high-level pulse-shaped output signal FE1 is output from the edge detection circuit 71, and the output signal FE1 is delayed in the delay circuit 72 to output a high-level pulse-shaped delayed signal DL1. When the restoration circuit 26 receives the second detection signal Det1 while the delayed signal DL1 is at a high level, a low-level set signal S is output from the NAND circuit 73 during a period when the delayed signal DL1 and the detection signal Det1 are both at a high level. As a result, the low-level set signal S is input to the set terminal of the input signal generation circuit 65, causing the input signal HINr to rise from a low level to a high level.

In addition, in response to a falling edge of the second detection signal Det1, a high-level pulse-shaped output signal FE1 is output from the edge detection circuit 71, and the output signal FE1 is delayed in the delay circuit 72 to output a high-level pulse-shaped delayed signal DL1. When the restoration circuit 26 receives the third detection signal Det1 while the delayed signal DL1 is at the high level, a low-level set signal S is output from the NAND circuit 73 during a period when the delayed signal DL1 and the detection signal Det1 are both at the high level. However, since the input signal generation circuit 65 has already been set, even when the low-level set signal S is input to the set terminal of the input signal generation circuit 65, the input signal HINr maintains the high level.

In addition, in response to a falling edge of the third detection signal Det1, a high-level pulse-shaped output signal FE1 is output from the edge detection circuit 71, and the output signal FE1 is delayed in the delay circuit 72 to output a high-level pulse-shaped delayed signal DL1. Since a next detection signal Det1 is not input while the delayed signal DL1 is at the high level, the set signal generation circuit 62 returns to an initial state thereof.

Thereafter, when a falling edge of the normal input signal HIN is input, the three high-level pulse-shaped detection signals Det2 are output sequentially from the detection circuit 25 (the signal detection circuit 52). First, when the restoration circuit 26 receives the first detection signal Det2, since the second mask signal is at a high level, the switching signal generation circuit 63 outputs the low-level switching signal Sw2 while the detection signal Det2 is at a high level. At this time, since the delayed signal DL2 is at the low level, even when the high-level detection signal Det2 is input to the NAND circuit 83, the reset signal R maintains the high level.

In addition, in response to a falling edge of the first detection signal Det2, a high-level pulse-shaped output signal FE2 is output from the edge detection circuit 81, and the output signal FE2 is delayed in the delay circuit 82 to output a high-level pulse-shaped delayed signal DL2. When the restoration circuit 26 receives the second detection signal Det2 while the delayed signal DL2 is at the high level, a low-level reset signal R is output from the NAND circuit 83 during a period when the delayed signal DL2 and the detection signal Det2 are both at the high level. As a result, the low-level reset signal R is input to the reset terminal of the input signal generation circuit 65, causing the input signal HINr to fall from a high level to a low level.

In addition, in response to a falling edge of the second detection signal Det2, a high-level pulse-shaped output signal FE2 is output from the edge detection circuit 81, and the output signal FE2 is delayed in the delay circuit 82 to output a high-level pulse-shaped delayed signal DL2. When the restoration circuit 26 receives the third detection signal Det2 while the delayed signal DL2 is at the high level, a low-level reset signal R is output from the NAND circuit 83 during a period when the delayed signal DL2 and the detection signal Det2 are both at the high level. However, since the input signal generation circuit 65 has already been reset, even when the low-level reset signal R is input to the reset terminal of the input signal generation circuit 65, the input signal HINr maintains the low level.

In addition, in response to a falling edge of the third detection signal Det2, a high-level pulse-shaped output signal FE2 is output from the edge detection circuit 81, and the output signal FE2 is delayed in the delay circuit 82 to output a high-level pulse-shaped delayed signal DL2. Since a next detection signal Det2 is not input while the delayed signal DL2 is at the high level, the reset signal generation circuit 64 returns to an initial state thereof.

Figure 7:
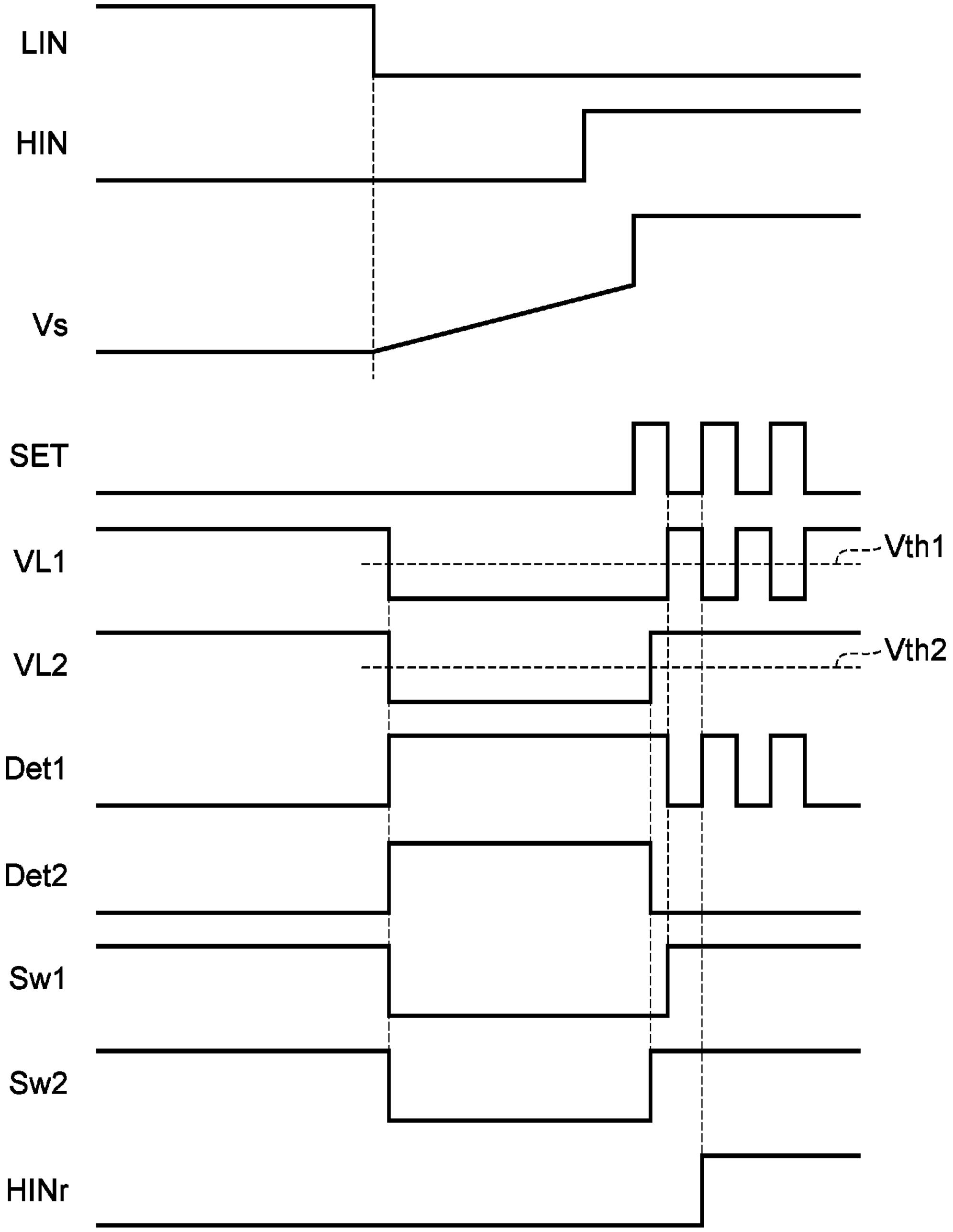
FIG. 7 is a diagram for explaining an operation of the drive circuit shown in FIG. 3 at the time of upward regeneration.
Figure 8:
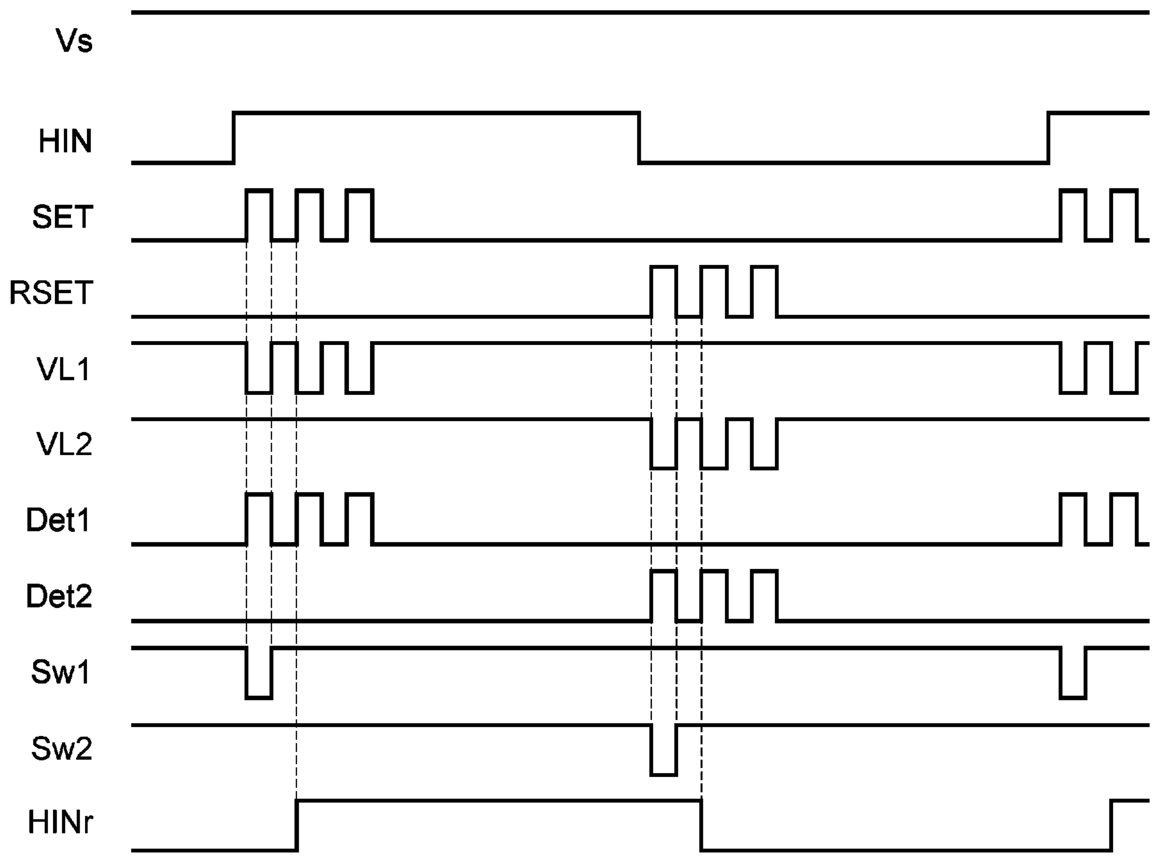
FIG. 8 is a diagram for explaining an operation of the drive circuit shown in FIG. 3 when a normal signal is input.

Next, an operation of the drive circuit 2 will be described with further reference to FIG. 7 and FIG. 8. FIG. 7 is a diagram for explaining an operation of the drive circuit shown in FIG. 3 at the time of upward regeneration. FIG. 8 is a diagram for explaining an operation of the drive circuit shown in FIG. 3 when a normal signal is input. The voltages VL1 and VL2, the detection signals Det1 and Det2, the switching signals Sw1 and Sw2, and the input signal HINr in FIG. 7 and FIG. 8 are represented based on the Vb-Vs reference.

As shown in FIG. 7, when an input signal LIN is switched from a high level to a low level and the transistor 4UL is switched from an on state to an off state, upward regeneration occurs in which a current flows from the U terminal T17 to the P terminal T16 via the freewheeling diode 5UH, and the voltage Vs of the U terminal T17 transitions from the voltage (low-side ground potential) of the NU terminal T20 toward a voltage obtained by adding a forward voltage of the freewheeling diode 5UH to the input voltage Vin supplied to the P terminal T16. At this time, the charging current Ic1 flows from the power supply line PLH to the transmission line L1 via the Zener diodes 41 and the resistor elements 42, thereby charging the transmission line L1, and the charging current Ic2 flows from the power supply line PLH to the transmission line L2 via the Zener diodes 43 and the resistor elements 44, thereby charging the transmission line L2.

During the above transition period of the voltage Vs, when the input signal HIN is not input, the pulse signals SETB and RSETB are not generated, and thus the voltages VL1 and VL2 are maintained at an original high level thereof. However, when a current-flowing capacity of the clamp circuit 24 is insufficient, the voltages VL1 and VL2 cannot follow a change in the voltage Vs. Therefore, when the voltages VL1 and VL2 are viewed with the voltage Vbu of the power supply line PLH as a high level and the voltage Vs as a low level (that is, when the voltage Vs is subtracted from each of the actual voltages VL1 and VL2), the voltages VL1 and VL2 drop temporarily from the high level.

When the voltage VL1 falls below the threshold voltage Vth1 of the signal detection circuit 51, the signal detection circuit 51 outputs the high-level detection signal Det1 to the restoration circuit 26, in the same manner as when the normal pulse signal SETB is input. When the voltage VL2 falls below the threshold voltage Vth2 of the signal detection circuit 52, the signal detection circuit 52 outputs the high-level detection signal Det2 to the restoration circuit 26, in the same manner as when the normal pulse signal RSETB is input.

In addition, when the restoration circuit 26 receives the high-level detection signal Det1 and the high-level detection signal Det2 from the detection circuit 25, the restoration circuit 26 uses the received high-level detection signal Det1 as the first detection signal Det1 to output the low-level switching signal Sw1, and uses the received high-level detection signal Det2 as the first detection signal Det2 to output the low-level switching signal Sw2. As a result, the switching elements 45 and 46 are switched from an off state to an on state. Therefore, the transmission line L1 is connected to the power supply line PLH via the switching element 45, and the transmission line L2 is connected to the power supply line PLH via the switching element 46, so that the transmission lines L1 and L2 are rapidly charged.

When the normal input signal HIN is input while the transmission line L1 is being charged, the generation circuit 22 generates three consecutive high-level pulse signals SET in response to detecting a rising edge of the input signal HIN, and outputs the three pulse signals SET sequentially to the level shift circuit 23. In addition, each time the level shift circuit 23 receives a high-level pulse signal SET from the generation circuit 22, the level shift circuit 23 converts the pulse signal SET to a low-level pulse signal SETB and outputs the pulse signal SETB to the transmission line L1.

While the transmission line L1 is being charged, since the voltage VL1 is lower than the threshold voltage Vth1, the pulse signal SETB output to the transmission line L1 during this time is buried in the drop in voltage VL1 caused by the upward regeneration, and is not detected as an individual pulse signal SETB. For this reason, the detection circuit 25 maintains the detection signal Det1 at a high level, and the restoration circuit 26 maintains the switching signal Sw1 at a low level. In the example shown in FIG. 7, charging the transmission line L1 and the transmission line L2 is completed while the first high-level pulse signal SET is being output. Thus, during a period from the start of the drop in the voltage VL1 due to the upward regeneration to a rising edge of the first pulse signal SETB, the voltage VL1 maintains a low level, the detection signal Det1 maintains a high level, and the switching signal Sw1 maintains a low level.

In addition, when the first pulse signal SETB rises and the voltage VL1 exceeds the threshold voltage Vth1, the detection signal Det1 is switched from a high level to a low level, and the switching signal Sw1 is switched from a low level to a high level. As a result, the switching element 45 is switched from an on state to an off state. On the other hand, since the pulse signal RSETB is not output to the transmission line L2, the voltage VL2 exceeds the threshold voltage Vth2 while the first pulse signal SET is being output, the detection signal Det2 is switched from a high level to a low level, and the switching signal Sw2 is switched from a low level to a high level. As a result, the switching element 46 is switched from an on state to an off state.

Subsequently, when the second pulse signal SETB is output to the transmission line L1, the voltage VL1 drops due to this pulse signal SETB. In addition, while the voltage VL1 is at a low level, the detection circuit 25 (the signal detection circuit 51) outputs a high-level detection signal Det1 to the restoration circuit 26. In addition, when the restoration circuit 26 receives the high-level detection signal Det1 from the detection circuit 25, since the detection signal Det1 is the second detection signal Det1, the restoration circuit 26 generates a rising edge of the input signal HINr in response to a rising edge of the detection signal Det1.

Subsequently, when the third pulse signal SETB is output to the transmission line L1, the voltage VL1 drops due to this pulse signal SETB. In addition, while the voltage VL1 is at a low level, the detection circuit 25 (the signal detection circuit 51) outputs a high-level detection signal Det1 to the restoration circuit 26. In addition, when the restoration circuit 26 receives the high-level detection signal Det1 from the detection circuit 25, since the detection signal Det1 is the third detection signal Det1, the restoration circuit 26 ignores this detection signal Det1.

As shown in FIG. 8, when the voltage Vs is stable and the normal input signal HIN is input, the generation circuit 22 generates three consecutive high-level pulse signals SET in response to detecting a rising edge of the input signal HIN, and outputs the three pulse signals SET sequentially to the level shift circuit 23. In addition, each time the level shift circuit 23 receives the high-level pulse signal SET from the generation circuit 22, the level shift circuit 23 converts the pulse signal SET to a low-level pulse signal SETB and outputs the pulse signal SETB to the transmission line L1.

When the first pulse signal SETB is output to the transmission line L1, the voltage VL1 drops due to this pulse signal SETB. In addition, the detection circuit 25 (the signal detection circuit 51) outputs a high-level detection signal Det1 to the restoration circuit 26 while the voltage VL1 is at a low level. In addition, when the restoration circuit 26 receives a high-level detection signal Det1 from the detection circuit 25, since the detection signal Det1 is the first detection signal Det1, the restoration circuit 26 outputs a low-level switching signal Sw1 to the switching element 45 while the detection signal Det1 is at a high level, thereby setting the switching element 45 to an on state. In this case, since the voltage VL1 is at the low level, a current flows from the power supply line PLH to the transistor 23*a* through the switching element 45 and the transmission line L1 in this order.

Subsequently, when the second pulse signal SETB is output to the transmission line L1, the voltage VL1 drops due to this pulse signal SETB. In addition, the detection circuit 25 (the signal detection circuit 51) outputs a high-level detection signal Det1 to the restoration circuit 26 while the voltage VL1 is at a low level. In addition, when the restoration circuit 26 receives the high-level detection signal Det1 from the detection circuit 25, since the detection signal Det1 is the second detection signal Det1, the restoration circuit 26 generates a rising edge of the input signal HINr in response to a rising edge of the detection signal Det1.

Subsequently, when the third pulse signal SETB is output to the transmission line L1, the voltage VL1 drops due to this pulse signal SETB. In addition, the detection circuit 25 (the signal detection circuit 51) outputs a high-level detection signal Det to the restoration circuit 26 while the voltage VL1 is at a low level. In addition, when the restoration circuit 26 receives the high-level detection signal Det1 from the detection circuit 25, since the detection signal Det1 is the third detection signal Det1, the restoration circuit 26 ignores the detection signal Det1.

Thereafter, the generation circuit 22 generates three consecutive high-level pulse signals RSET in response to detecting a falling edge of the input signal HIN, and outputs the three pulse signals RSET sequentially to the level shift circuit 23. In addition, each time the level shift circuit 23 receives the high-level pulse signal RSET from the generation circuit 22, the level shift circuit 23 converts the pulse signal RSET to a low-level pulse signal RSETB and outputs the pulse signal RSETB to the transmission line L2.

When the first pulse signal RSETB is output to the transmission line L2, the voltage VL2 drops due to this pulse signal RSETB. In addition, the detection circuit 25 (the signal detection circuit 52) outputs a high-level detection signal Det2 to the restoration circuit 26 while the voltage VL2 is at a low level. In addition, when the restoration circuit 26 receives the high-level detection signal Det2 from the detection circuit 25, since the detection signal Det2 is the first detection signal Det2, the restoration circuit 26 outputs a low-level switching signal Sw2 to the switching element 46 while the detection signal Det2 is at a high level, thereby setting the switching element 46 to an on state. In this case, since the voltage VL2 is at the low level, a current flows from the power supply line PLH to the transistor 23*b* through the switching element 46 and the transmission line L2 in this order.

Subsequently, when the second pulse signal RSETB is output to the transmission line L2, the voltage VL2 drops due to this pulse signal RSETB. In addition, the detection circuit 25 (the signal detection circuit 52) outputs a high-level detection signal Det2 to the restoration circuit 26 while the voltage VL2 is at a low level. In addition, when the restoration circuit 26 receives the high-level detection signal Det2 from the detection circuit 25, since the detection signal Det2 is the second detection signal Det2, the restoration circuit 26 generates a falling edge of the input signal HINr in response to a rising edge of the detection signal Det2.

Subsequently, when the third pulse signal RSETB is output to the transmission line L2, the voltage VL2 drops due to this pulse signal RSETB. In addition, the detection circuit 25 (the signal detection circuit 52) outputs a high-level detection signal Det2 to the restoration circuit 26 while the voltage VL2 is at a low level. In addition, when the restoration circuit 26 receives the high-level detection signal Det2 from the detection circuit 25, since the detection signal Det2 is the third detection signal Det2, the restoration circuit 26 ignores the detection signal Det2.

In addition, when the voltage Vs is stable, the transmission lines L1 and L2 are clamped to the voltage Vbu. Therefore, it is not necessary to charge the transmission lines L1 and L2. However, it is recognized that even in such a case, no operational problems occur.

Pulse widths of the plurality of pulse signals SET are substantially the same. When the pulse width of the pulse signal SET is long, a time from a rising edge of the input signal HIN to a rising edge of the input signal HINr becomes long, and there is a concern that the drive circuit 2 cannot operate at a high speed. Therefore, in order to operate the drive circuit 2 at the high speed, the pulse width of the pulse signal SET may be set to be short. In this case, since charging the transmission line L1 may not be completed by the first pulse signal SET, next pulse signals SET are used until charging the transmission line L1 is completed. For this reason, when the number of pulse signals SET is small, there may be case in which a rising edge of the input signal HIN cannot be restored. Therefore, the pulse width of the pulse signal SET and the number of consecutive pulse signals SET are set appropriately so that a detection failure of signals does not occur, while taking into consideration a time required to charge the transmission line L1. The same applies to the pulse width of the pulse signal RSET and the number of consecutive pulse signals RSET.

In the above-described embodiment, since the transistor 23*a* capable of driving the switching element 45 is used, even when charging the transmission line L1 is completed while a high-level pulse signal SET is being output, the voltage VL1 maintains a low level until a falling edge of the high-level pulse signal SET. When the transistor 23*a* incapable of driving the switching element 45 is used, when charging the transmission line L1 is completed while the high-level pulse signal SET is being output, the voltage VL1 becomes a high level, and the switching element 45 is switched from an on state to an off state. In addition, the voltage VL1 becomes a low level again by the remaining part of the pulse signal SET. When the remaining part of the pulse signal SET has a pulse width capable of being detected by the signal detection circuit 51, a high-level detection signal Det1 is output, and a rising edge of the input signal HIN is restored. When the remaining part of the pulse signal SET does not have a pulse width capable of being detected by the signal detection circuit 51, since a high-level detection signal Det1 is not output even when the voltage VL1 becomes a low level, a rising edge of the input signal HIN is restored by a next pulse signal SET.

As described above, during the transition period of the voltage Vs due to the upward regeneration, the voltages VL1 and VL2 may drop temporarily from a high level. For example, when the generation circuit 22 generates a single high-level pulse signal SET in response to a rising edge of the input signal HIN, a single low-level pulse signal SETB is output to the transmission line L1. When the input signal HIN is input while charging the transmission line L1 is not sufficient, the pulse signal SETB may be buried in the drop in the voltage VL1 caused by the upward regeneration, and may not be detected.

On the other hand, in the drive circuit 2, when the voltage VL1 is at a low level (the voltage VL1 is lower than the threshold voltage Vth1), a high-level detection signal Det1 is output, and the switching element 45 is set to an on state in response to the first detection signal Det1. Thus, the transmission line L1 is charged rapidly, and a rising edge of the input signal HIN is restored in response to the second detection signal Det1. Similarly, in the drive circuit 2, when the voltage VL2 is at a low level (the voltage VL2 is lower than the threshold voltage Vth2), a high-level detection signal Det2 is output, and the switching element 46 is set to an on state in response to the first detection signal Det2. Thus, the transmission line L2 is charged rapidly, and a falling edge of the input signal HIN is restored in response to the second detection signal Det2.

With the configuration described above, when the voltage VL1 drops temporarily from a high level during the transition period of the voltage Vs due to the upward regeneration, a high-level detection signal Det1 is output in the same manner as when the normal pulse signal SETB is input. However, since the output high-level detection signal Det1 is the first detection signal Det1, no rising edge of the input signal HINr is generated, and the switching element 45 is set to an on state to charge the transmission line L1 rapidly. Similarly, when the voltage VL2 drops temporarily from a high level during the transition period of the voltage Vs due to the upward regeneration, a high-level detection signal Det2 is output in the same manner as when the normal pulse signal RSETB is input. However, since the output high-level detection signal Det2 is the first detection signal Det2, no falling edge of the input signal HINr is generated, and the switching element 46 is set to an on state to charge the transmission line L2 rapidly. Therefore, it is possible to suppress erroneous detection due to the drop in the voltage VL1 and voltage VL2 caused by the upward regeneration, to increase a charging speed of the transmission lines L1 and L2, and to suppress a detection failure of the normal pulse signal SETB.

In addition, in the drive circuit 2, a plurality of consecutive high-level pulse signals SET are generated in response to a rising edge of the input signal HIN, and each pulse signal SET is converted to a low-level pulse signal SETB to output the pulse signal SETB sequentially to the transmission line L1. When the first pulse signal SETB is output to the transmission line L1 after charging of the transmission line L1 is completed, the voltage VL1 drops due to this pulse signal SETB, and the high-level detection signal Det1 is output. Since this detection signal Det is the second detection signal Det1, a rising edge of the input signal HINr is generated in response to a rising edge of this detection signal Det1.

When the pulse signal SETB is output to the transmission line L1 before charging of the transmission line L1 is completed, the pulse signal SETB is buried in the drop in the voltage VL1 caused by the upward regeneration, and is not detected as an individual pulse signal SETB. However, it is considered that the first detection signal Det1 is continuing, the switching element 45 maintains an on state, and the rapid charging of the transmission line L1 continues. In addition, the voltage VL1 drops due to the pulse signal SETB output to the transmission line L1 after charging of the transmission line L1 is completed, and a high-level detection signal Det1 is output. Since this detection signal Det1 is the second detection signal Det1, a rising edge of the input signal HINr is generated in response to a rising edge of the detection signal Det1. From the above, with the drive circuit 2, it is possible to suppress a detection failure of the normal pulse signal SETB. As a result, it is possible to improve detection accuracy of the normal signal.

Since the first detection signal Det1 is assigned to charging, it is not necessary to determine whether the low level of the voltage VL1 is the normal pulse signal SETB or an erroneous signal. Therefore, since it is not necessary that the drive circuit 2 includes a circuit for determining whether the low level of the voltage VL1 is the normal pulse signal SETB or an erroneous signal, it is possible to make the drive circuit 2 smaller in size.

After the rising edge of the input signal HINr is generated, the pulse signal SETB is output to the transmission line L1, and even when a high-level detection signal Det1 is output, the detection signal Det1 is ignored. Therefore, it is possible to avoid erroneous detection of the pulse signal SETB while suppressing a detection failure of the normal pulse signal SETB.

There may be a case in which ringing of the voltage Vbu occurs to make the voltages VL1 and VL2 unstable. For example, when the generation circuit 22 generates a single high-level pulse signal RSET in response to a falling edge of the input signal HIN, a single low-level pulse signal RSETB is output to the transmission line L2. When the falling edge of the input signal HIN is input while the voltage Vbu is ringing, the pulse signal RSETB may be buried in the drop in the voltage VL2 caused by the ringing of the voltage Vbu, and may not be detected.

On the other hand, in the drive circuit 2, when the voltage VL2 is at a low level (the voltage VL2 is lower than the threshold voltage Vth2), a high-level detection signal Det2 is output and the switching element 46 is set to an on state in response to the first detection signal Det2. Thus, the transmission line L2 is charged rapidly, and a falling edge of the input signal HIN is restored in response to the second detection signal Det2.

With the configuration described above, when the voltage VL2 drops temporarily from a high level due to the ringing of the voltage Vbu, a high-level detection signal Det2 is output in the same manner as when the normal pulse signal RSETB is input. However, since the output high-level detection signal Det2 is the first detection signal Det2, no falling edge of the input signal HINr is generated, and the switching element 46 is set to an on state to charge the transmission line L2 rapidly. Similarly, when the voltage VL1 drops temporarily from a high level due to the ringing of the voltage Vbu, no rising edge of the input signal HINr is generated, and the switching element 45 is set to an on state to charge the transmission line L1 rapidly. Therefore, it is possible to suppress erroneous detection due to the drop in the voltages VL1 and VL2 caused by the upward regeneration, to increase a charging speed of the transmission lines L1 and L2, and to suppress a detection failure of the normal pulse signal RSETB.

In addition, in the drive circuit 2, a plurality of consecutive high-level pulse signals RSET are generated in response to a falling edge of the input signal HIN, and each pulse signal RSET is converted to a low-level pulse signal RSETB to output the pulse signal RSETB sequentially to the transmission line L2. When the pulse signal RSETB is output to the transmission line L2 before charging of the transmission line L2 is completed, the pulse signal RSETB is buried in the drop in the voltage VL2 caused by the ringing of the voltage Vbu, and is not detected as an individual pulse signal RSETB. However, it is considered that the first detection signal Det2 is continuing, the switching element 46 maintains an on state, and the rapid charging of the transmission line L2 continues.

In addition, the voltage VL2 drops due to the pulse signal RSETB output to the transmission line L2 after charging of the transmission line L2 is completed, and a high-level detection signal Det2 is output. Since this detection signal Det2 is the second detection signal Det2, a falling edge of the input signal HINr is generated in response to a rising edge of the detection signal Det2. From the above, with the drive circuit 2, it is possible to suppress a detection failure of the normal pulse signal RSETB. As a result, it is possible to further improve the detection accuracy of the normal signal.

After the falling edge of the input signal HINr is generated, the pulse signal RSETB is output to the transmission line L2, and even when a high-level detection signal Det2 is output, the detection signal Det2 is ignored. Therefore, it is possible to avoid erroneous detection of the pulse signal RSETB while suppressing a detection failure of the normal pulse signal RSETB.

In addition, the drive circuit according to the present disclosure is not limited to the above-described embodiment.

When a falling edge of the input signal HIN is input, the voltages VL1 and VL2 are usually stable. Therefore, the generation circuit 22 may generate a single high-level pulse signal RSET in response to the falling edge of the input signal HIN. In this case, the restoration circuit 26 may generate a falling edge of the input signal HINr in response to detecting the high-level pulse-shaped detection signal Det2 output from the detection circuit 25, and the clamp circuit 24 may not include the switching element 46.

Active elements may be used instead of the Zener diodes 41 and 43. For example, the clamp circuit 24 may include, instead of the Zener diodes 41 and 43, a diode-connected transistor that flows the charging current Ic1 from the power supply line PLH to the transmission line L1, a diode-connected transistor that flows the charging current Ic2 from the power supply line PLH to the transmission line L2, and a resistor element that commonly connects these transistors to the power supply line PLH.

In the above-described embodiment, description has been made using enhancement-type MOSFETs as the transistors and switching elements, but each transistor and switching element may be a depletion-type MOSFET or a junction-type FET. Each transistor and switching element may be a bipolar transistor. In this case, the gate, the source, and the drain of the MOSFET are replaced with the base, the emitter, and the collector, respectively.

Although the present disclosure has been described in detail above, it is apparent to those skilled in the art that the present disclosure is not limited to the embodiment described herein. The present disclosure may be modified and altered without departing from the spirit and scope of the present disclosure as defined by the claims. Therefore, the description of the present disclosure is for illustrative purposes only and does not have any limiting meaning to the present disclosure.

Any reference to elements using designations such as "first" and "second" used in the present disclosure does not limit a quantity or order of those elements. These designations may be used in the present disclosure as a convenient way of distinguishing between two or more elements. Thus, reference to first and second elements does not imply either that only two elements may be employed or that the first element must precede the second element in some way. In the present disclosure, when a first element is used, it does not imply that there is a presupposition that two or more elements are present.

[Supplementary Note 1]

A drive circuit for a high-side transistor, including:

a generation circuit configured to generate a plurality of consecutive high-level first pulse signals in response to a first edge of an input signal, and generate a high-level second pulse signal in response to a second edge of the input signal;

a level shift circuit configured to convert the plurality of first pulse signals to a plurality of low-level set pulse signals, respectively, and output the plurality of set pulse signals sequentially to a first transmission line, and configured to convert the second pulse signal to a low-level reset pulse signal and output the reset pulse signal to a second transmission line;

a clamp circuit configured to clamp a first voltage of the first transmission line and a second voltage of the second transmission line, wherein the clamp circuit includes a first switching element provided between a power supply line of a high-side power supply potential and the first transmission line and configured to be switchable between an on state in which the power supply line and the first transmission line are electrically connected and an off state in which the power supply line and the first transmission line are disconnected;

a detection circuit configured to output a first detection signal in response to detecting that the first voltage is at a low level, and output a second detection signal in response to detecting that the second voltage is at a low level; and a restoration circuit configured to set the first switching element to the on state in response to a first-first detection signal output from the detection circuit, and restore the first edge of the input signal in response to a second-first detection signal output from the detection circuit.

[Supplementary Note 2]

The drive circuit of Supplementary Note 1, wherein the restoration circuit ignores third and subsequent-first detection signals output from the detection circuit.

[Supplementary Note 3]

The drive circuit of Supplementary Note 1 or 2, wherein the generation circuit generates a plurality of high-level second pulse signals in response to the second edge, wherein the clamp circuit further includes a second switching element provided between the power supply line and the second transmission line and configured to be switchable between an on state in which the power supply line and the second transmission line are electrically connected and an off state in which the power supply line and the second transmission line are disconnected, and wherein the restoration circuit sets the second switching element to the on state in response to a first-second detection signal output from the detection circuit and restores the second edge of the input signal in response to a second-second detection signal output from the detection circuit.

[Supplementary Note 4]

The drive circuit of Supplementary Note 3, wherein the restoration circuit ignores third and subsequent-second detection signals output from the detection circuit.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A drive circuit for a high-side transistor, comprising:

a generation circuit configured to generate a plurality of consecutive high-level first pulse signals in response to a first edge of an input signal, and generate a high-level second pulse signal in response to a second edge of the input signal;

a level shift circuit configured to convert the plurality of first pulse signals to a plurality of low-level set pulse signals, respectively, and output the plurality of set pulse signals sequentially to a first transmission line, and configured to convert the second pulse signal to a low-level reset pulse signal and output the reset pulse signal to a second transmission line;

a clamp circuit configured to clamp a first voltage of the first transmission line and a second voltage of the second transmission line, wherein the clamp circuit includes a first switching element provided between a power supply line of a high-side power supply potential and the first transmission line and configured to be switchable between an on state in which the power supply line and the first transmission line are electrically connected and an off state in which the power supply line and the first transmission line are disconnected;

a detection circuit configured to output a first detection signal in response to detecting that the first voltage is at a low level, and output a second detection signal in response to detecting that the second voltage is at a low level; and a restoration circuit configured to set the first switching element to the on state in response to a first-first detection signal output from the detection circuit, and restore the first edge of the input signal in response to a second-first detection signal output from the detection circuit.

2. The drive circuit of claim 1, wherein the restoration circuit ignores third and subsequent-first detection signals output from the detection circuit.

3. The drive circuit of claim 1, wherein the generation circuit generates a plurality of high-level second pulse signals in response to the second edge, wherein the clamp circuit further includes a second switching element provided between the power supply line and the second transmission line and configured to be switchable between an on state in which the power supply line and the second transmission line are electrically connected and an off state in which the power supply line and the second transmission line are disconnected, and wherein the restoration circuit sets the second switching element to the on state in response to a first-second detection signal output from the detection circuit and restores the second edge of the input signal in response to a second-second detection signal output from the detection circuit.

4. The drive circuit of claim 3, wherein the restoration circuit ignores third and subsequent-second detection signals output from the detection circuit.

* * * * *